(12) United States Patent
Liu et al.

(10) Patent No.: US 8,932,936 B2
(45) Date of Patent: Jan. 13, 2015

(54) METHOD OF FORMING A FINFET DEVICE

(75) Inventors: Chia-Chu Liu, Hsinchu (TW);
Kuei-Shun Chen, Hsin-Chu (TW);
Chih-Hsiung Peng, Miaoli County (TW); Chi-Kang Chang, New Taipei (TW); Chiang Mu-Chi, Hsinchu (TW); Sheng-Yu Chang, Hsinchu (TW); Hua Feng Chen, Hsinchu (TW); Chao-Cheng Chen, Shin-Chu (TW); Ryan Chia-Jen Chen, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 29 days.

(21) Appl. No.: 13/449,118

(22) Filed: Apr. 17, 2012

(65) Prior Publication Data
US 2013/0273711 A1    Oct. 17, 2013

(51) Int. Cl.
*H01L 21/00* (2006.01)

(52) U.S. Cl.
USPC ........... 438/424; 438/151; 438/586; 438/703; 257/E21.158; 257/E21.214; 257/308; 257/722

(58) Field of Classification Search
USPC .......... 438/424, 586, 703; 257/308, E21.158, 257/E21.214
See application file for complete search history.

(56) References Cited

U.S. PATENT DOCUMENTS

| | | | |
|---|---|---|---|
| 8,395,209 B1* | 3/2013 | Ho et al. | 257/330 |
| 2007/0034925 A1* | 2/2007 | Lee et al. | 257/296 |
| 2010/0183961 A1* | 7/2010 | Shieh et al. | 430/30 |
| 2013/0043506 A1* | 2/2013 | Tsai et al. | 257/192 |
| 2013/0059401 A1* | 3/2013 | Sudo | 438/3 |
| 2013/0115777 A1* | 5/2013 | Tung et al. | 438/703 |

* cited by examiner

*Primary Examiner* — Thao X Le
*Assistant Examiner* — Matthew Gordon
(74) *Attorney, Agent, or Firm* — Haynes and Boone, LLP

(57) ABSTRACT

A method for fabricating a device is disclosed. An exemplary method includes providing a substrate and forming a plurality of fins over the substrate. The method further includes forming a first opening in the substrate in a first longitudinal direction. The method further includes forming a second opening in the substrate in a second longitudinal direction. The first and second longitudinal directions are different. The method further includes depositing a filling material in the first and second openings.

19 Claims, 20 Drawing Sheets

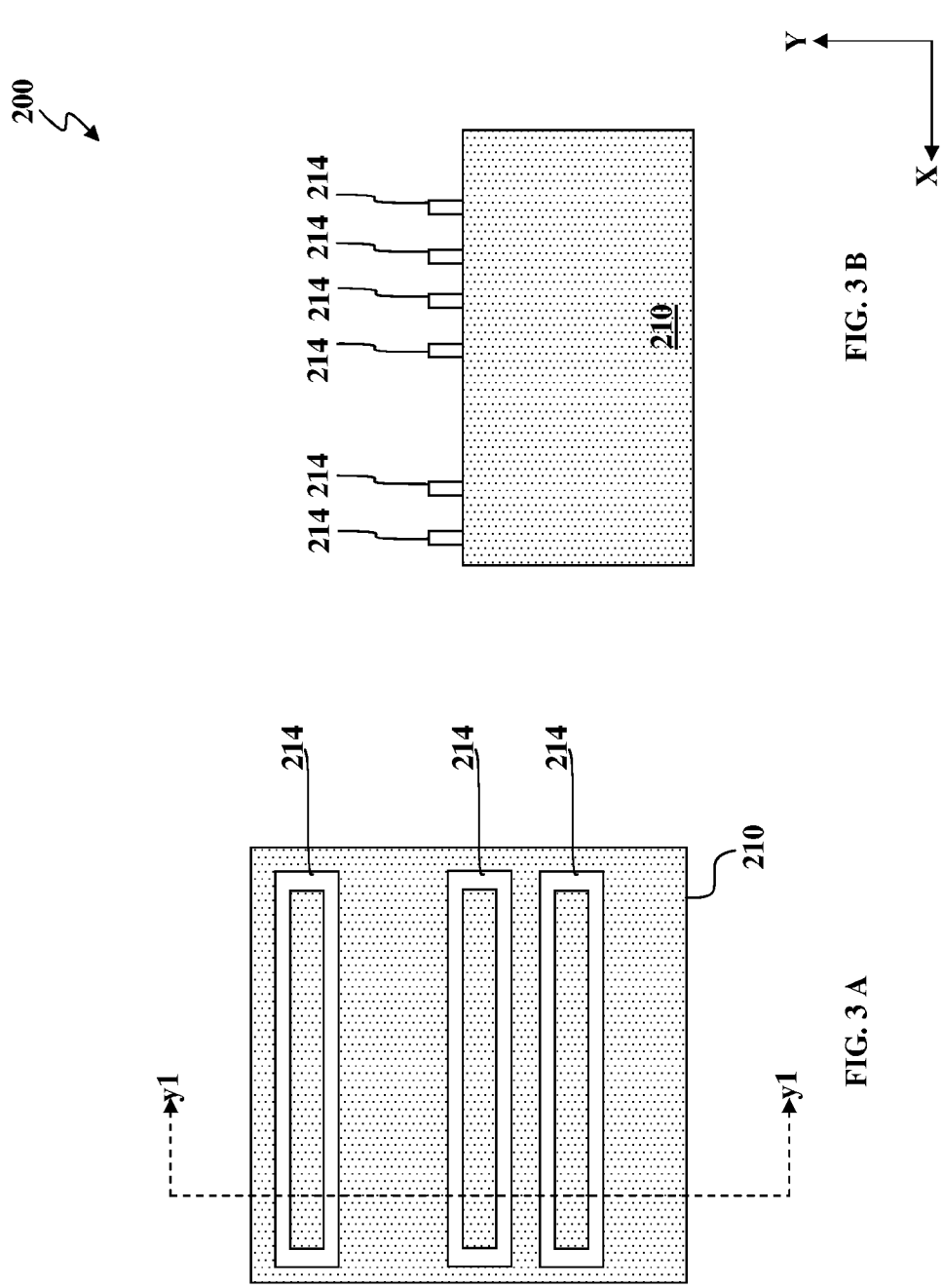

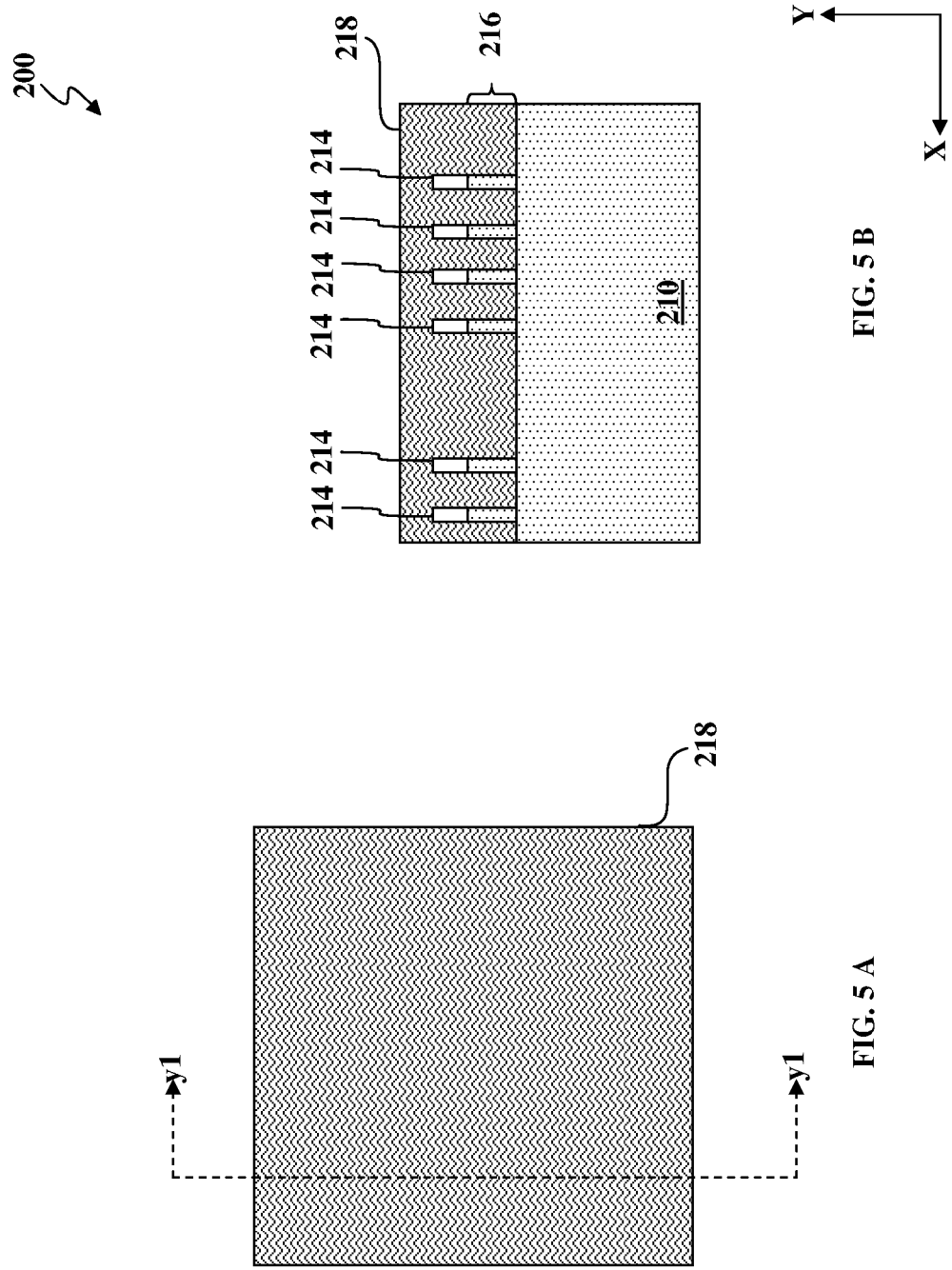

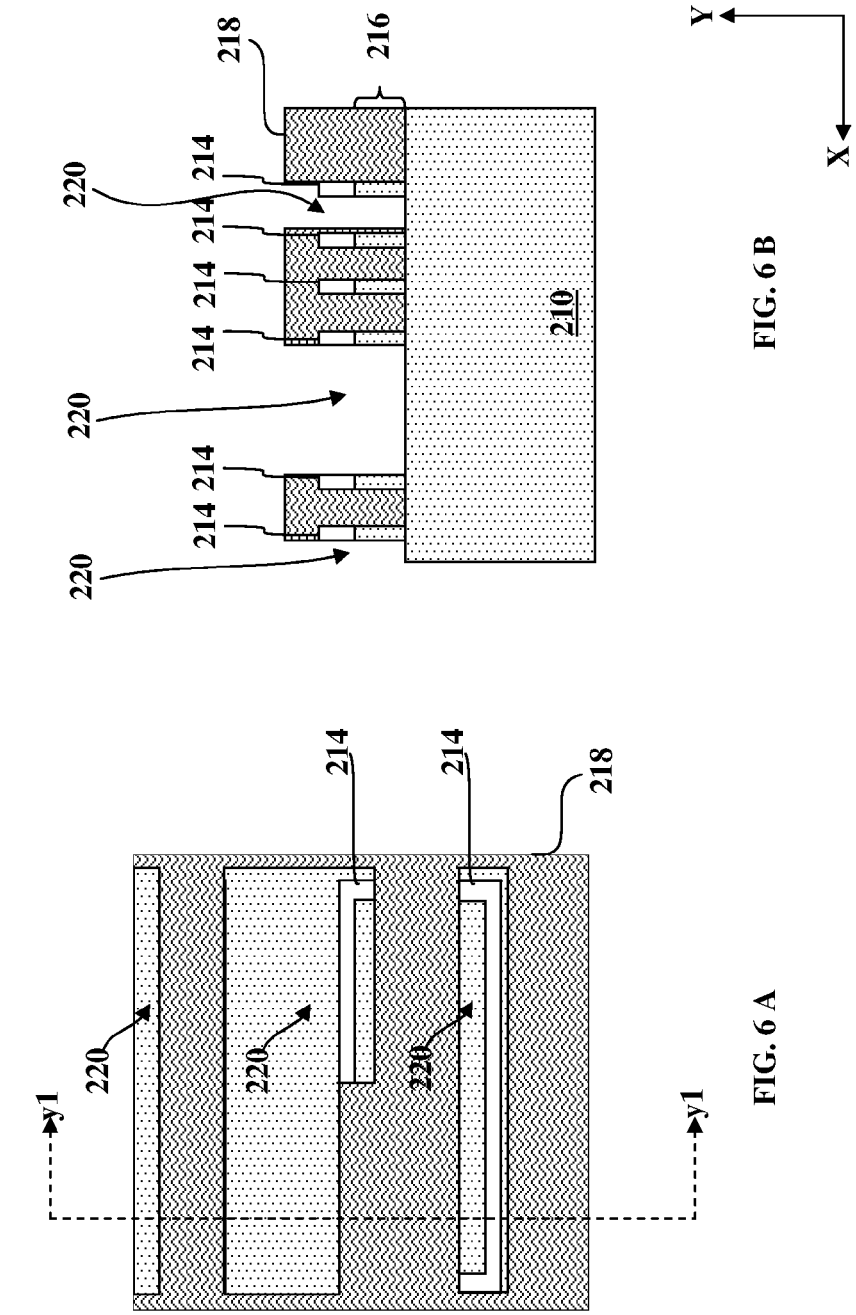

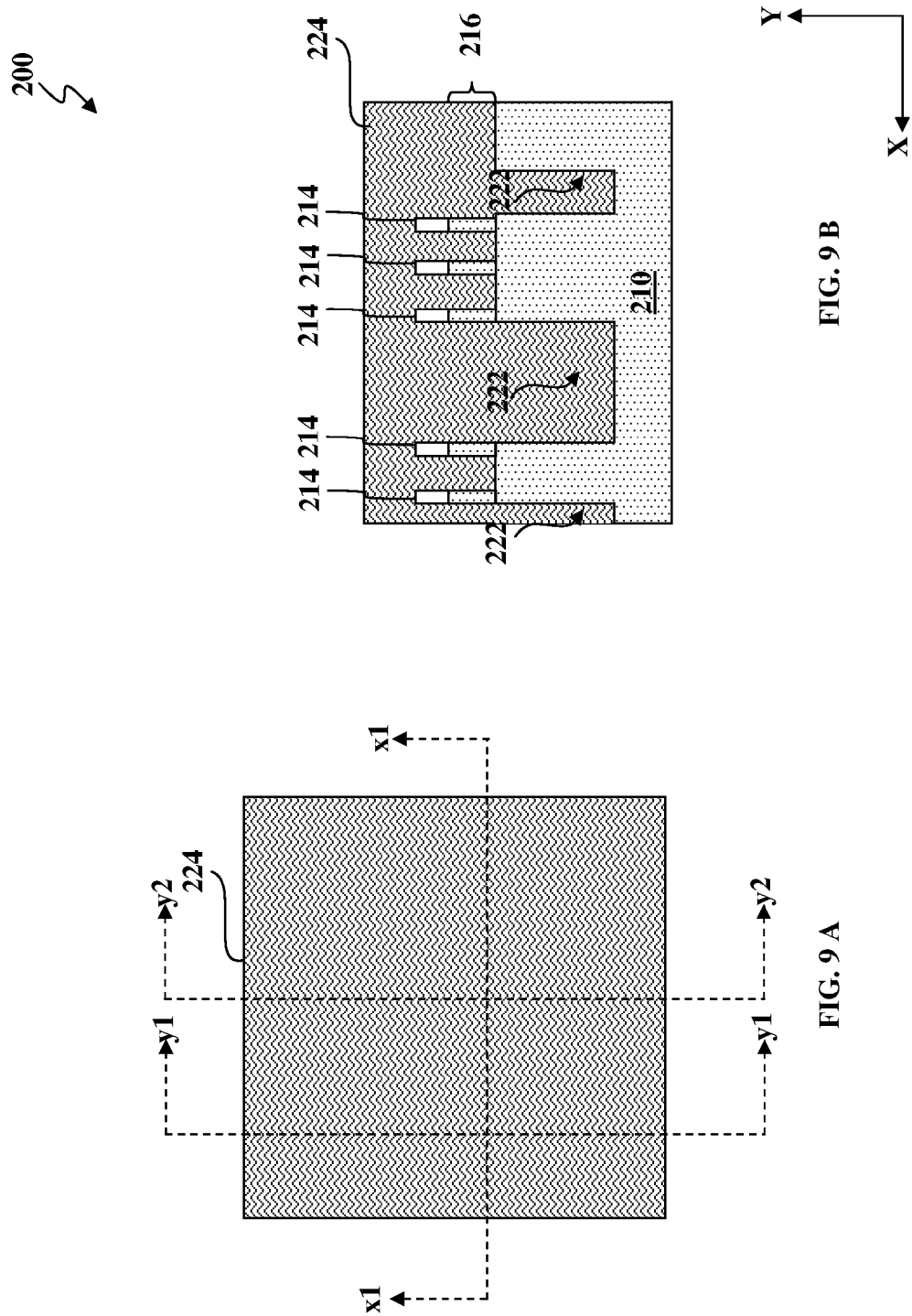

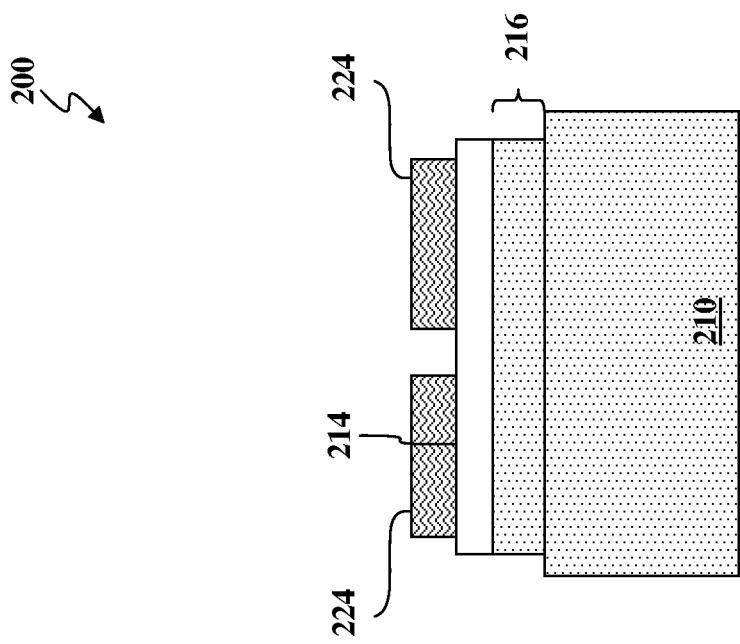
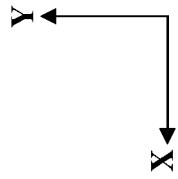
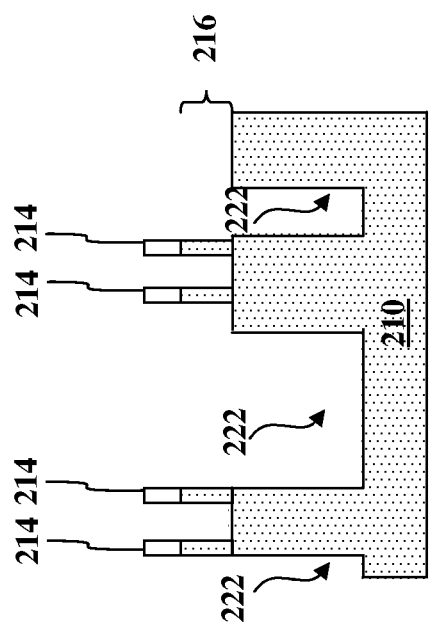
FIG. 10 C
FIG. 10 D

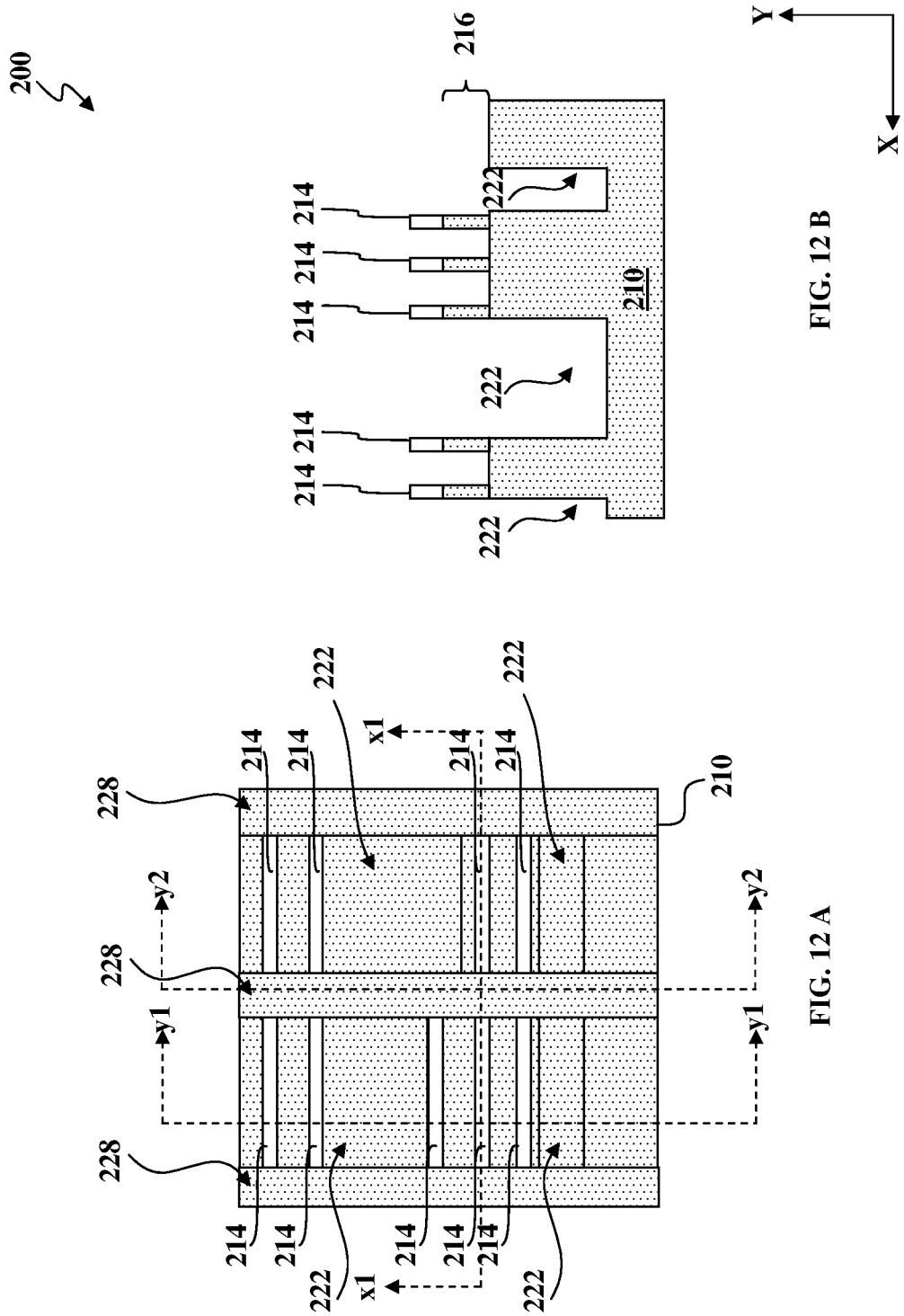

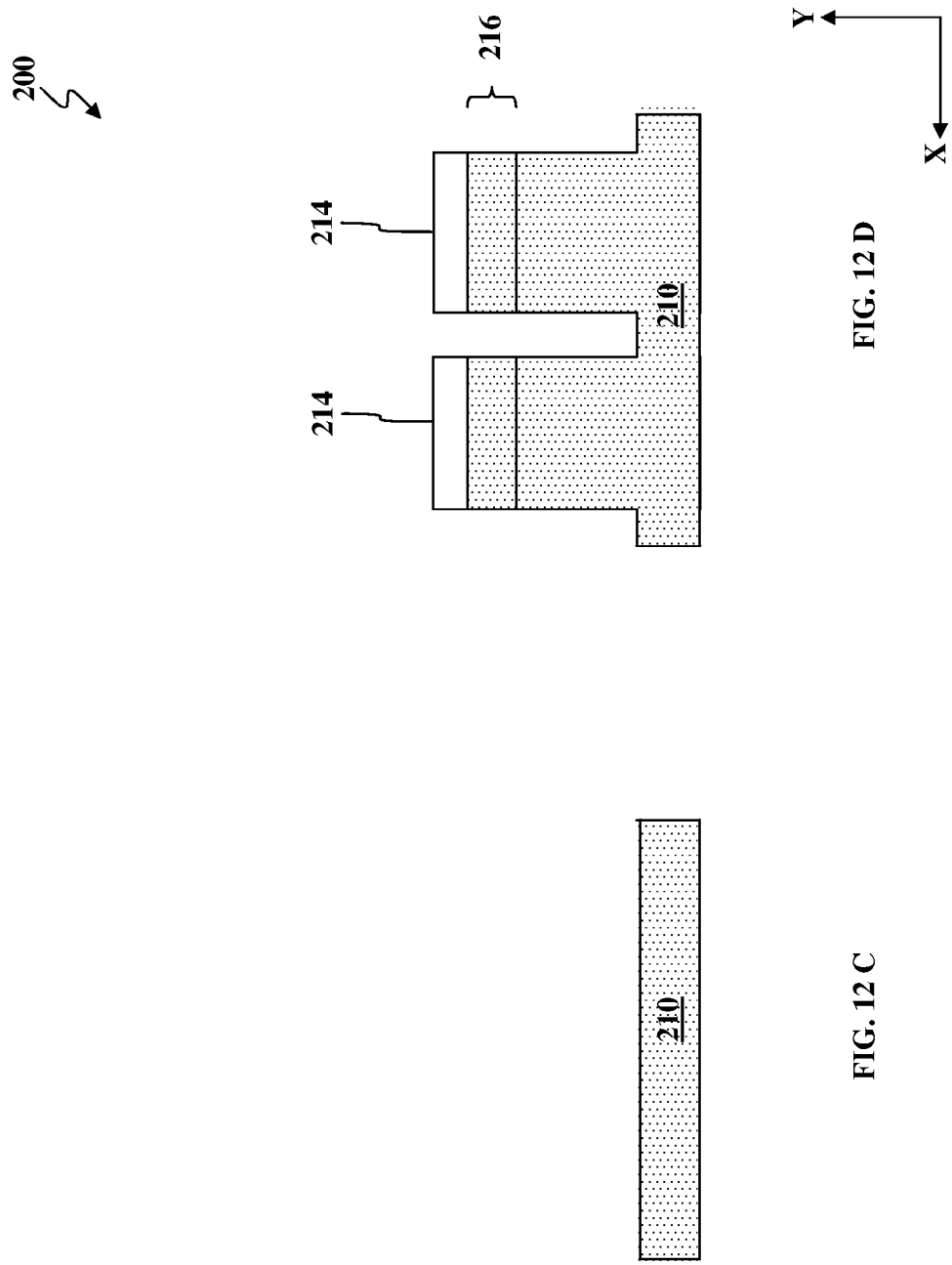

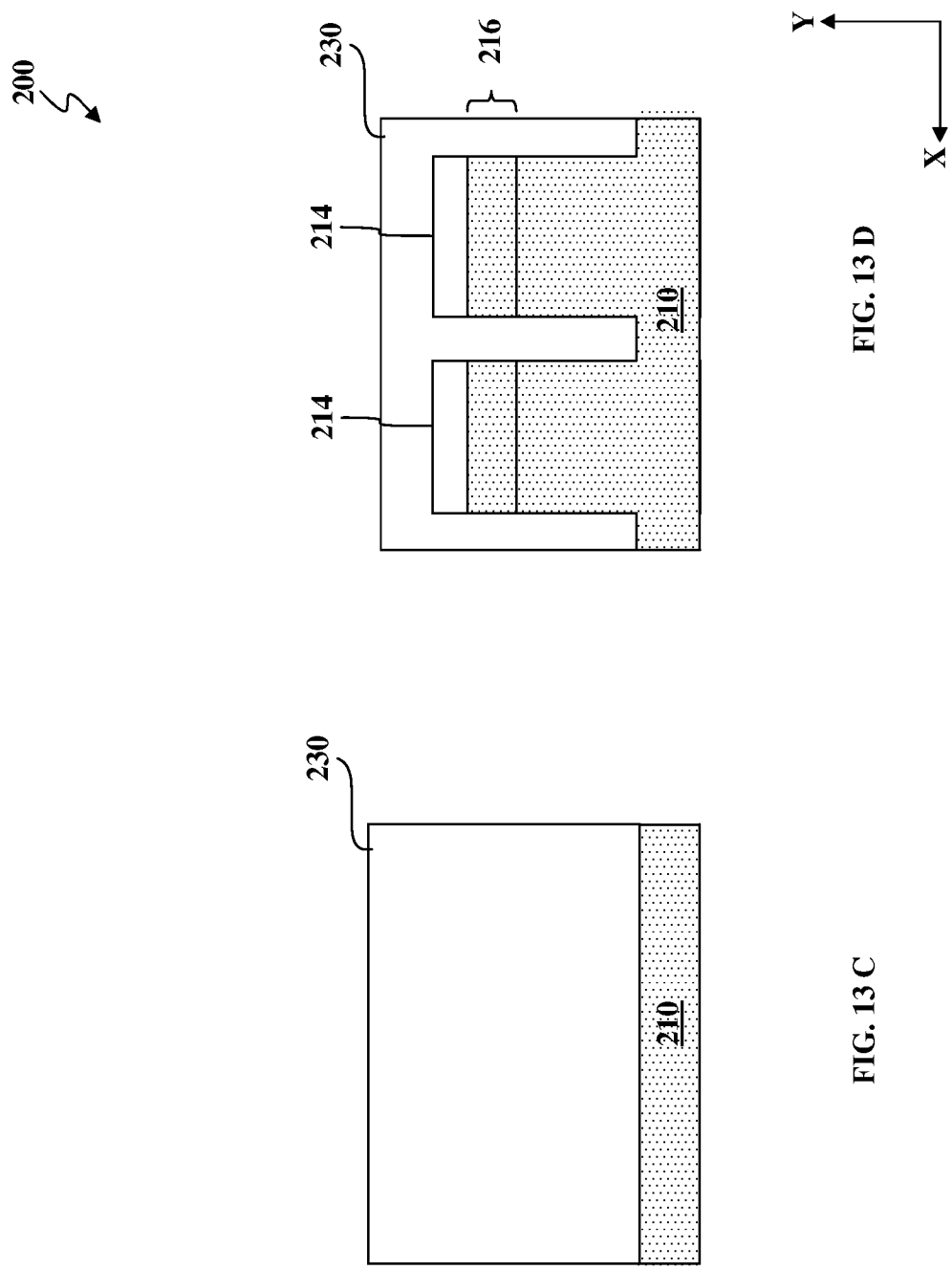

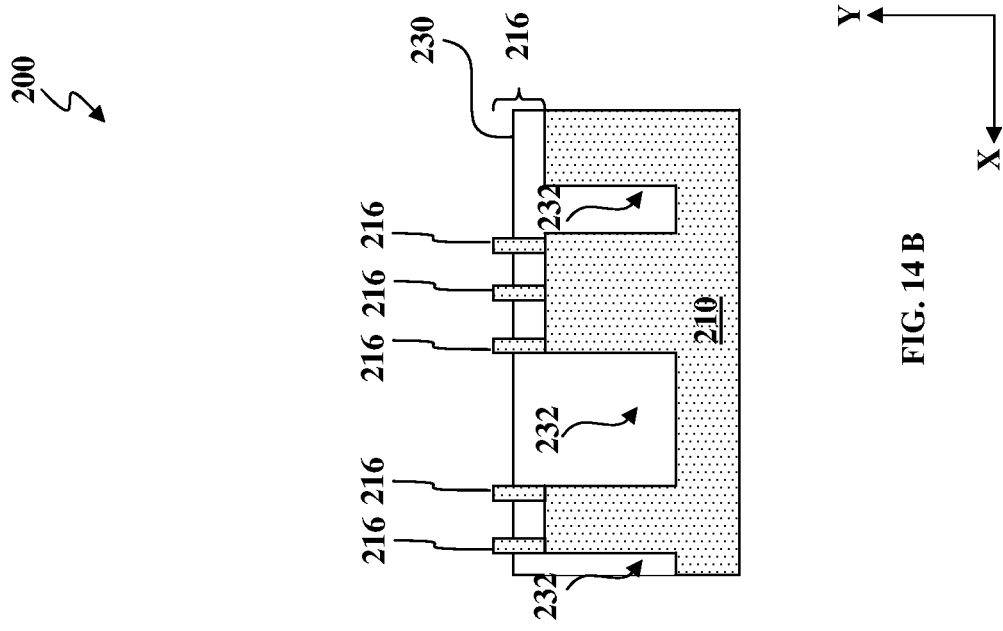
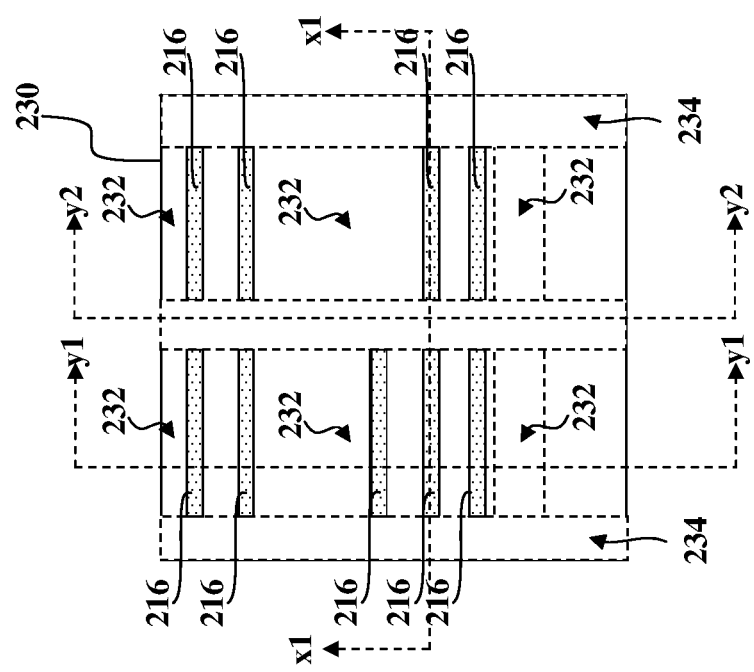
FIG. 14 B
FIG. 14 A

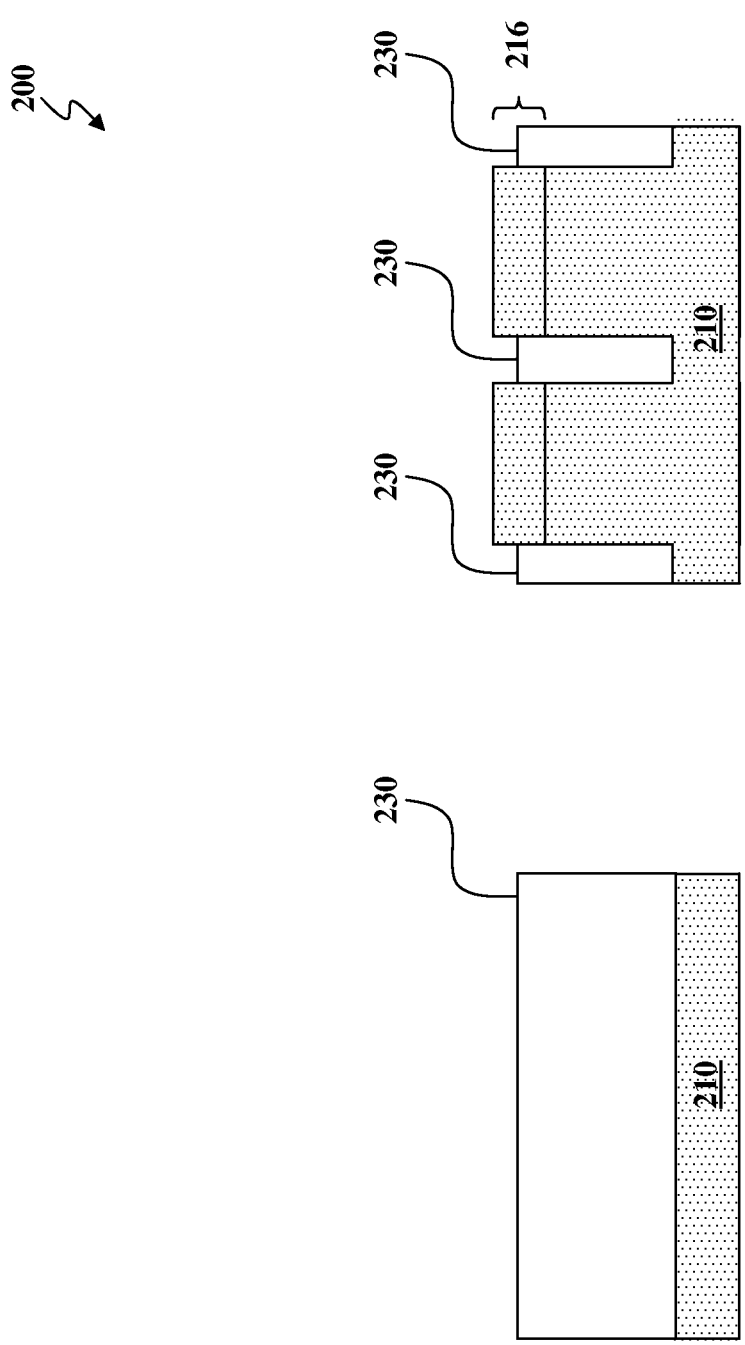

METHOD OF FORMING A FINFET DEVICE

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of fin-like field effect transistor (FinFET) devices. Although existing FinFET devices and methods of fabricating FinFET devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-14A illustrate diagrammatic top views of one embodiment of a semiconductor device at various stages of fabrication, according to the method of FIG. 1.

FIGS. 2B-14B illustrate diagrammatic cross-sectional side views of FIGS. 2A-14A taken along line y1-y1.

FIGS. 9C-14C illustrate diagrammatic cross-sectional side views of FIGS. 9A-14A taken along line y2-y2.

FIGS. 9D-14D illustrate diagrammatic cross-sectional side views of FIGS. 9A-14A taken along line x1-x1.

DETAILED DESCRIPTION

Figure 1:
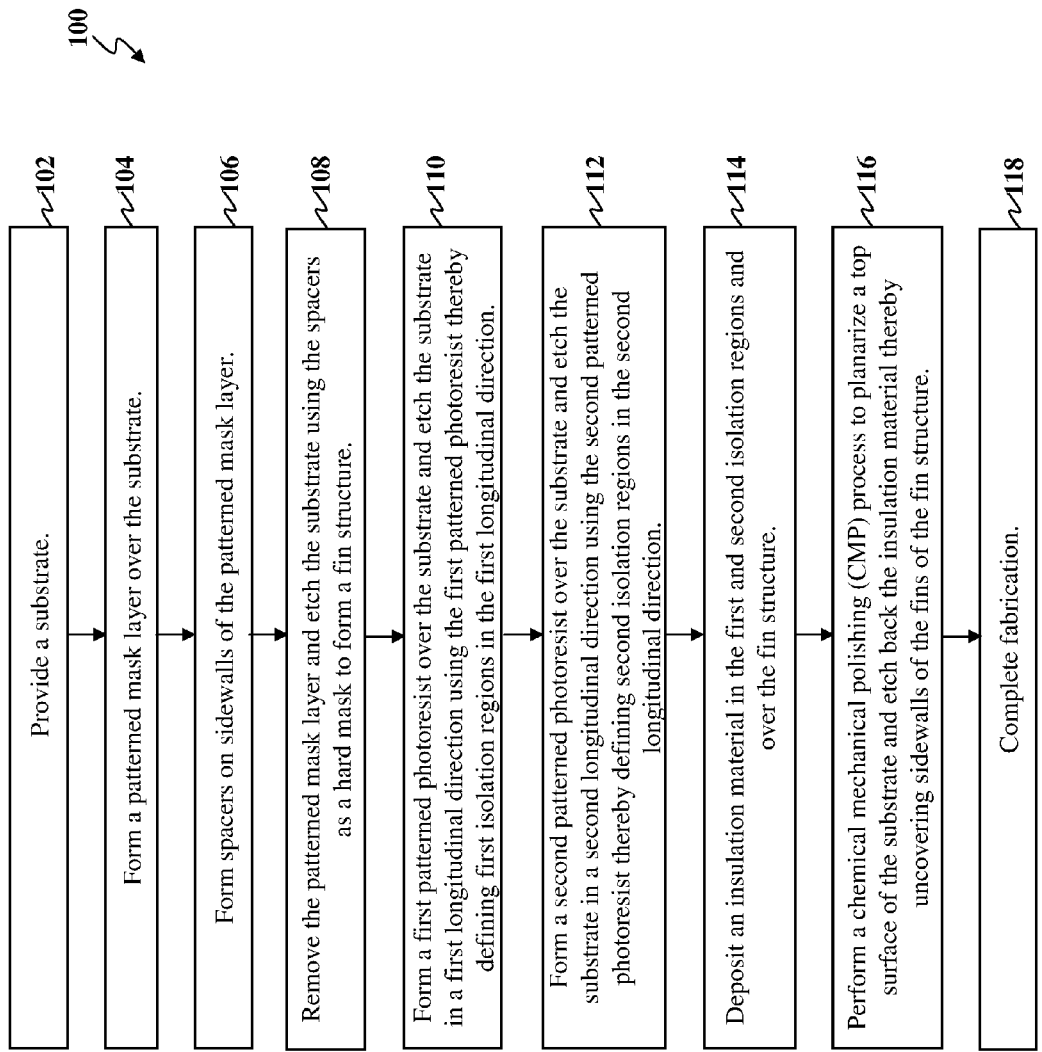
FIG. 1 is a flowchart illustrating a method of fabricating a semiconductor device according to various aspects of the present disclosure.

The following disclosure provides many different embodiments, or examples, for implementing different features of the application. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present application.

Examples of devices that can benefit from one or more embodiments of the present application are semiconductor devices. Such a device, for example, is a fin-like field effect transistor (FinFET). The FinFET device, for example, may be a complementary metal-oxide-semiconductor (CMOS) device comprising a P-type metal-oxide-semiconductor (PMOS) FinFET device and a N-type metal-oxide-semiconductor (NMOS) FinFET device. The following disclosure will continue with a FinFET example to illustrate various embodiments of the present application. It is understood, however, that the application should not be limited to a particular type of device, except as specifically claimed.

With reference to FIGS. 1 and 2-14, a method 100 and a semiconductor device 200 are collectively described below. FIG. 1 is a flow chart of a method 100 for fabricating an integrated circuit device according to various aspects of the present disclosure. In the present embodiment, the method 100 is for fabricating an integrated circuit device that includes a fin-like field effect transistor (FinFET) device. The method 100 begins at block 102 where a substrate is provided. The method continues with block 104 where a patterned mask layer is formed over the substrate. The method continues with block 106 where spacers are formed on sidewalls of the patterned mask layer. The method continues with block 108 where the patterned mask layer is selectively removed and the substrate is etched using the spacers as a hard mask to form a fin structure including a plurality of fins. The method continues with block 110 where a first patterned photoresist is formed over the substrate and the substrate is etched in a first longitudinal direction using the first patterned photoresist thereby defining shallow trench isolation (STI) regions in the first longitudinal direction. The method continues with block 112 where a second patterned photoresist is formed over the substrate and the substrate is etched in a second longitudinal direction (different from the first longitudinal direction) using the second patterned photoresist thereby defining second STI regions in the second longitudinal direction. The method 100 continues with block 114 where an insulation material is deposited in the first and second STI regions and over the fin structure. The method continues with block 116 where a chemical mechanical polishing (CMP) process is performed to planarize the top surface of the substrate and the insulation material is etched back thereby uncovering sidewalls of the plurality of fins of the fin structure. The method 100 continues with block 118 where fabrication of the integrated circuit device is completed.

Completing the fabrication process may include, among other things, forming a gate stack over a channel region of the fin structure and forming source and drain (S/D) feature in a S/D region of the semiconductor device. Forming the gate stack may include a gate first or a gate last process. For example, in a gate first process, forming the gate stack may include depositing a dielectric layer over the fin structure, forming a gate structure (e.g., gate electrode) over the dielectric layer, and forming gate spacers on the walls of the gate structure and adjacent to the S/D region of the semiconductor device. Thereafter, a S/D feature may be formed in the S/D region by recessing the semiconductor material in the S/D region and depositing a doped semiconductor material in the S/D region. The deposition of the doped semiconductor material may include epi growing the semiconductor material. Additional steps can be provided before, during, and after the method 100, and some of the steps described can be replaced or eliminated for other embodiments of the method. The discussion that follows illustrates various embodiments of a semiconductor device that can be fabricated according to the method 100 of FIG. 1.

FIGS. 2A-14A illustrate diagrammatic top views of one embodiment of a semiconductor device at various stages of fabrication, according to the method of FIG. 1. FIGS. 2B-14B illustrate diagrammatic cross-sectional side views of FIGS. 2A-14A taken along line y1-y1; FIGS. 9C-14C illustrate diagrammatic cross-sectional side views of FIGS. 9A-14A taken along line y2-y2; and FIGS. 9D-14D illustrate diagrammatic cross-sectional side views of FIGS. 9A-14A taken along line x1-x1. In the present disclosure, the semiconductor device is a FinFET device 200. The FinFET device 200 may be included in a microprocessor, memory cell, and/or other integrated circuit device. FIGS. 2-14 have been simplified for the sake of clarity to better understand the inventive concepts of the present disclosure. Additional features can be added in the FinFET device 200, and some of the features described below can be replaced or eliminated in other embodiments of the FinFET device 200.

Figure 2B:
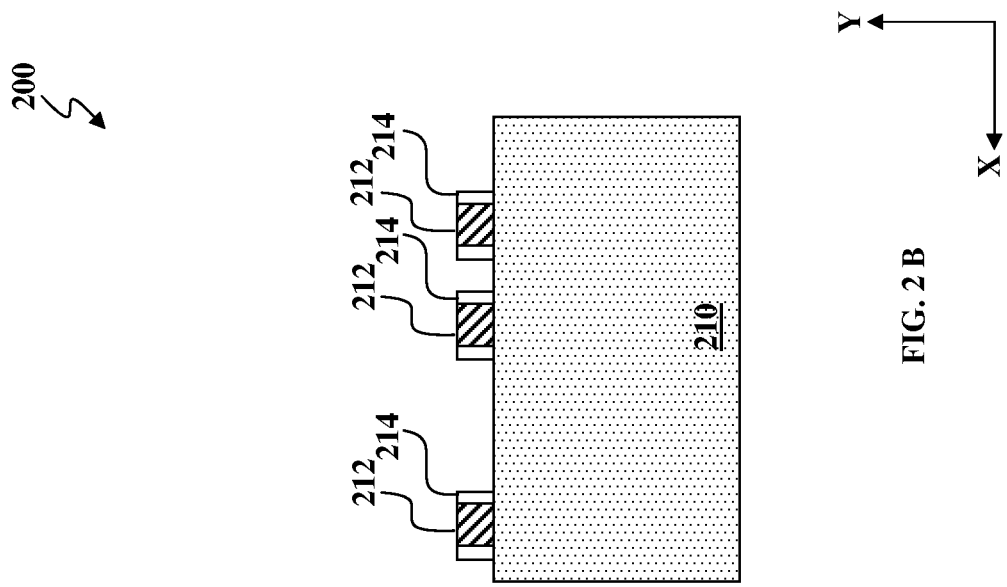
Figure 2A:
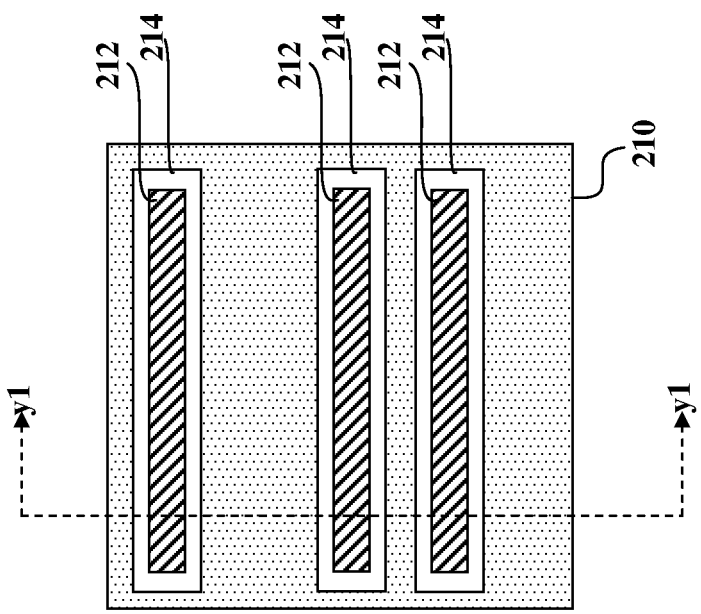

Referring to FIGS. 2A,B, the FinFET device 200 includes a substrate 210. The substrate 210 is a bulk silicon substrate. Alternatively, the substrate 210 comprises an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Alternatively, the substrate 210 includes a silicon-on-insulator (SOI) substrate. The SOI substrate can be fabricated using separation by implantation of oxygen (SIMOX), wafer bonding, and/or other suitable methods. The substrate 210 may include various doped regions and other suitable features.

Still referring to FIGS. 2A,B, formed over the substrate is a patterned mask layer 212. The patterned mask layer 212 may include a dielectric material such as silicon oxide, silicon nitride layer, silicon oxynitride, or any suitable dielectric. In the present embodiment, the patterned mask layer 212 is silicon nitride. The patterned mask layer 212 is formed by any suitable process to any suitable thickness. In the present embodiment, the patterned mask layer 212 is formed by a CVD process. In various examples, the patterned mask layer 212 can be formed by atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino)Silane (BTBAS or C8H22N2Si) and Disilane (DS or Si2H6). The mask layer 212 may be patterned by any suitable process such as a photolithography and etching process. The photolithography process, for example, may include depositing a photoresist layer, exposing the photoresist layer to a pattern, performing a post-exposure bake process, developing the photoresist layer, and etching the mask layer 212 with the patterned photoresist layer.

With continued reference to FIGS. 2A,B, formed on the sidewalls of the patterned mask layer 212 are spacers 214. The spacers 214 are formed by a suitable process to a suitable thickness. In the present embodiment, for example, a dielectric layer, such as a silicon oxide layer, is blanket deposited over the FinFET device 200; and then, the silicon oxide layer is dry etched to remove the silicon oxide layer to form spacers 214 as illustrated. In alternative embodiments, the spacers 214 include another dielectric material, such as silicon nitride, silicon oxynitride, or other suitable materials. Notably, having the material of the mask layer 212 and the spacers 214 be different allows the mask layer 212 to be selectively removed (as illustrated in FIGS. 3A,B).

Referring to FIGS. 3A,B, the mask layer 212 (of FIGS. 2A,B) is selectively removed by any suitable process, such as an etching process, while not removing the spacers 214. The etching process may include dry etching or a combination of dry and wet etching.

Figure 4B:
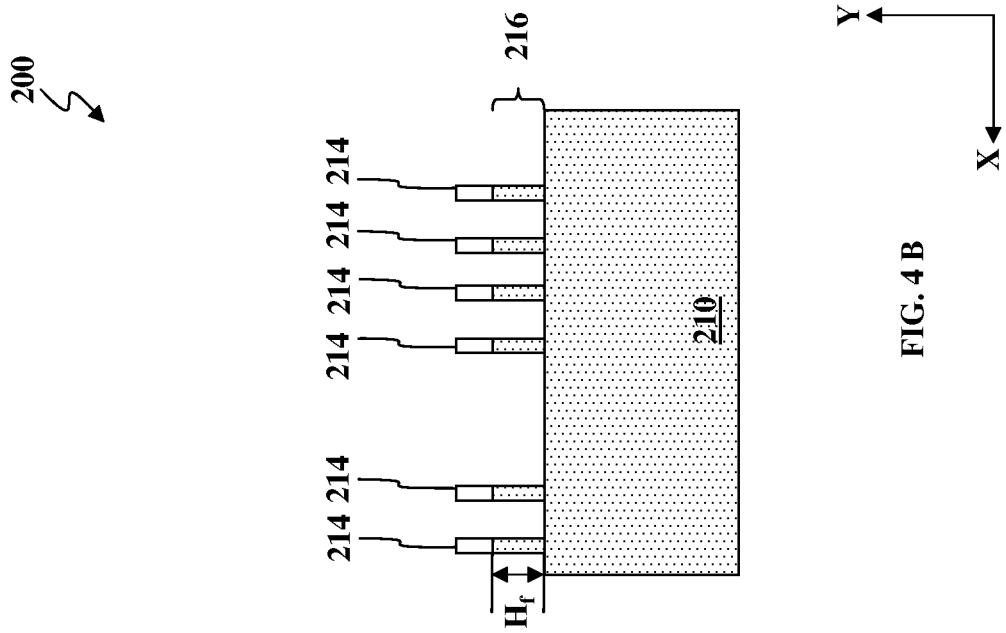
Figure 4A:
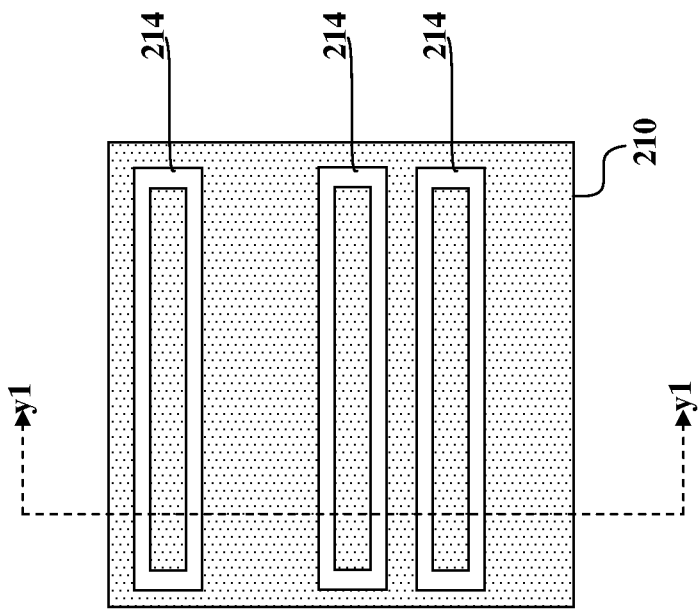

Referring to FIGS. 4A,B, after the removal of the mask layer 212, the substrate 210 is etched to define a fin structure 216. The etching for defining the fin structure 216 (which may also be referred to as crown patterning) is shallow when compared to subsequent deep etching used to define shallow trench isolation (STI) regions of the device 200. The etching process uses the spacers 214 as a hard mask to define the area to be etched and to protect other regions of the FinFET device 200. The protected regions result in the fin structure 216 including a plurality of fins. Each fin of the fin structure 216 may have any height according to design requirements. In the present embodiment, for example, each fin of the fin structure has a height $H_f$ (measured from the top surface of the substrate 210 to a top surface of the fin) of about 400 nm. In alternative embodiments, each fin of the fin structure has a height $H_f$ less than about 1 micron. In some embodiments, the etching process includes a wet etching process, a dry etching process, or a combination thereof. The etching process may use a reactive ion etch (RIE) and/or other suitable process. In one example, a dry etching process used to etch the substrate 210 includes a fluorine-containing gas chemistry such as CF4, SF6, NF3, or any suitable gas.

Referring to FIGS. 5A,B, after the substrate 210 is etched to define the fin structure 216, a first photoresist layer 218 is deposited over and substantially covers the FinFET device 200. Referring to FIGS. 6A,B, the first photoresist layer 218 is patterned by forming a first plurality of openings 220 in a first longitudinal direction. In the present embodiment, the first longitudinal direction is in the horizontal (X) direction. The first plurality of openings 220 define a first plurality of shallow trench isolation (STI) regions of the FinFET device 200. Forming the first plurality of openings 220 includes exposing the first photoresist layer 218 to a pattern, performing a post-exposure bake process, and developing the photoresist layer to form a masking element. In some embodiments, the photoresist layer patterning may include processing steps of photoresist coating, soft baking, mask aligning, exposing pattern, post-exposure baking, developing photoresist, and hard baking. In some embodiments, the patterning can also be implemented or replaced by other proper methods, such as maskless photolithography, electron-beam writing, ion-beam writing, and molecular imprint.

Figures 7A, 7B:
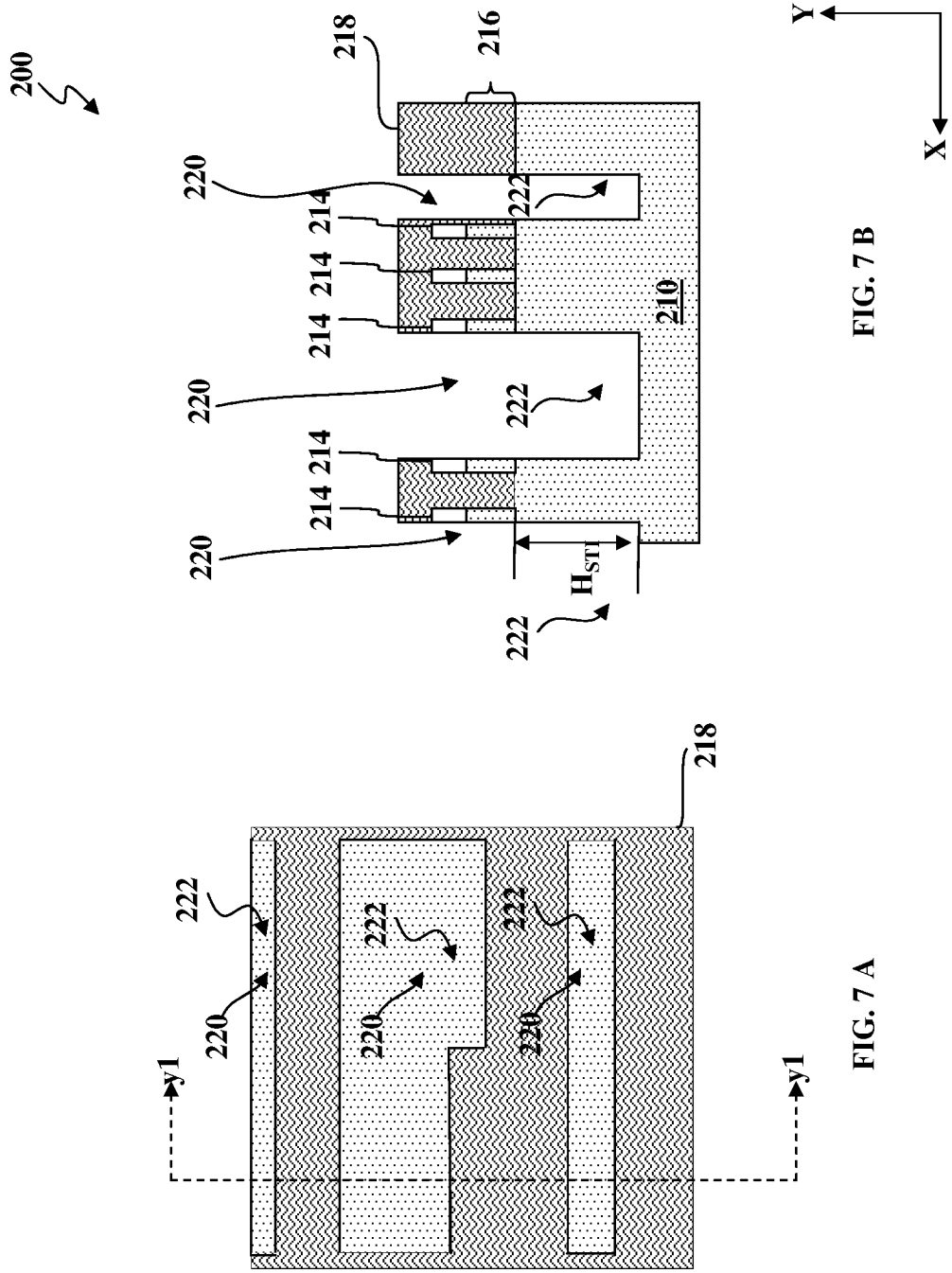

Referring to FIGS. 7A,B, after the first photoresist layer 218 has been patterned, an etching process may be used to define the horizontal boundaries of active regions of the FinFET device 200 and to define first STI regions. The etching process first removes uncovered portions of the spacers 214, thereby uncovering a top surface of certain fins of the fin structure 216 within the plurality of openings 220. In one example, a hydrofluoric acid (HF) or buffered HF is used to remove the spacers 214. The plurality of openings 220 of the first photoresist layer 218 are then used in an etching process to etch first STI regions 222 into the substrate 210. The first STI regions 222 may have any height according to design requirements. In the present embodiment, for example, the first STI regions 222 have a height $H_{STI}$ (measured from the bottom surface of the substrate 210 to a top surface of the substrate 210) from about 0.1 microns to about 2 microns. In some embodiments, the etching process includes a wet etching process, a dry etching process, or a combination thereof. In another example, a dry etching process used to etch the substrate 210 includes a chemistry including fluorine-containing gas. In furtherance of the example, the chemistry of the dry etch includes CF4, SF6, or NF3.

Figure 8B:
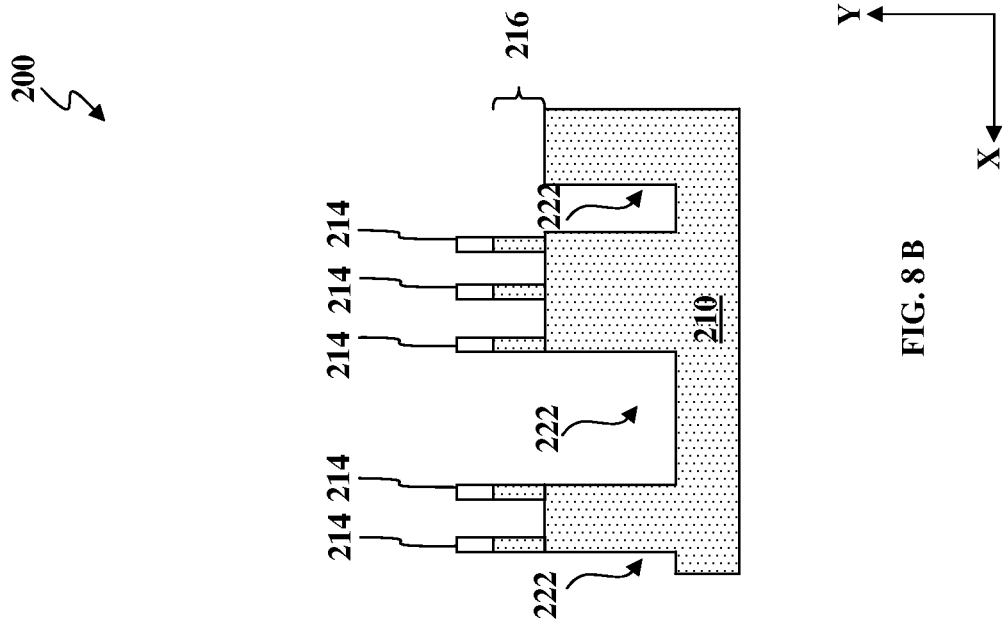
Figure 8A:
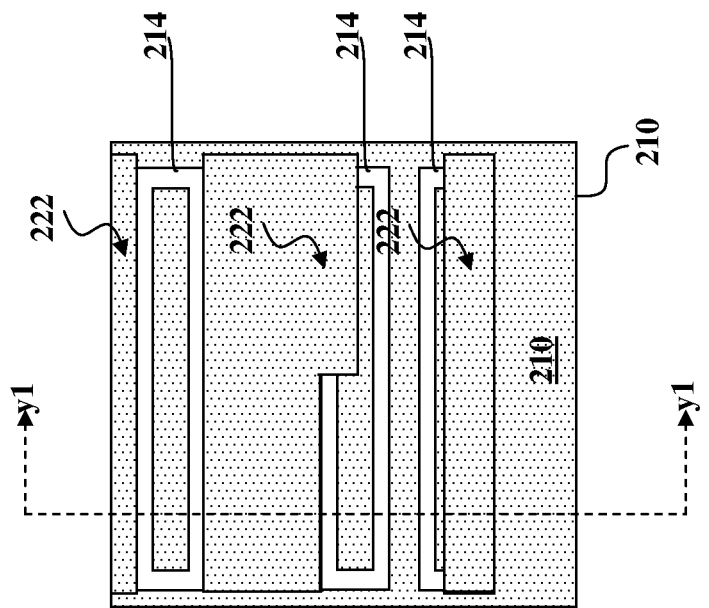
Figure 9:
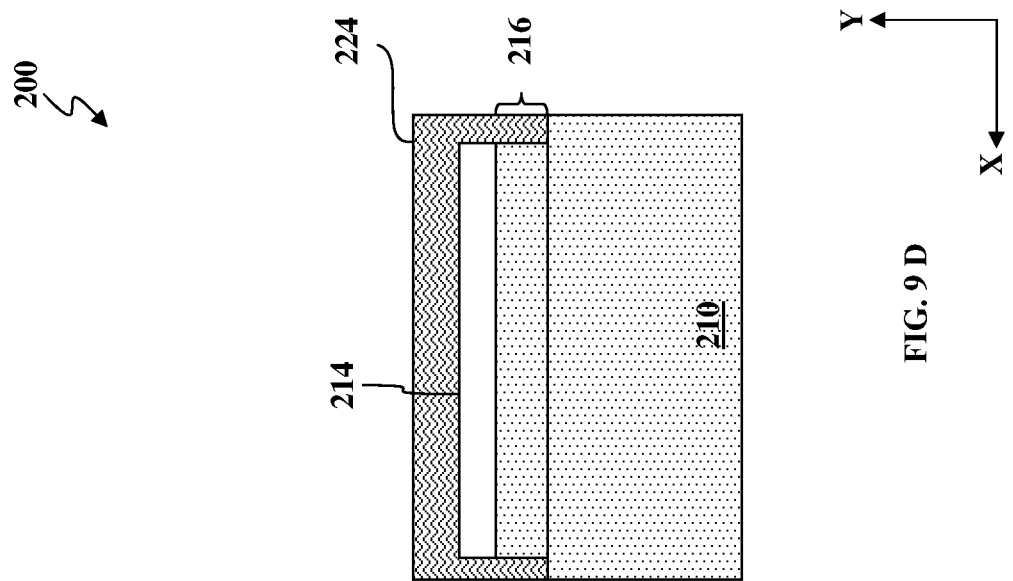
Figure 9:
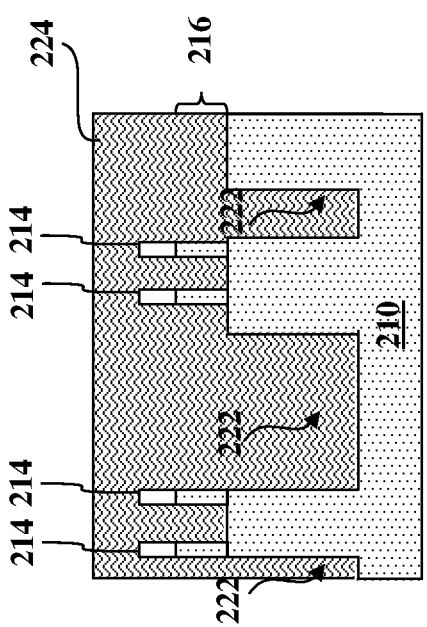
Figure 10:
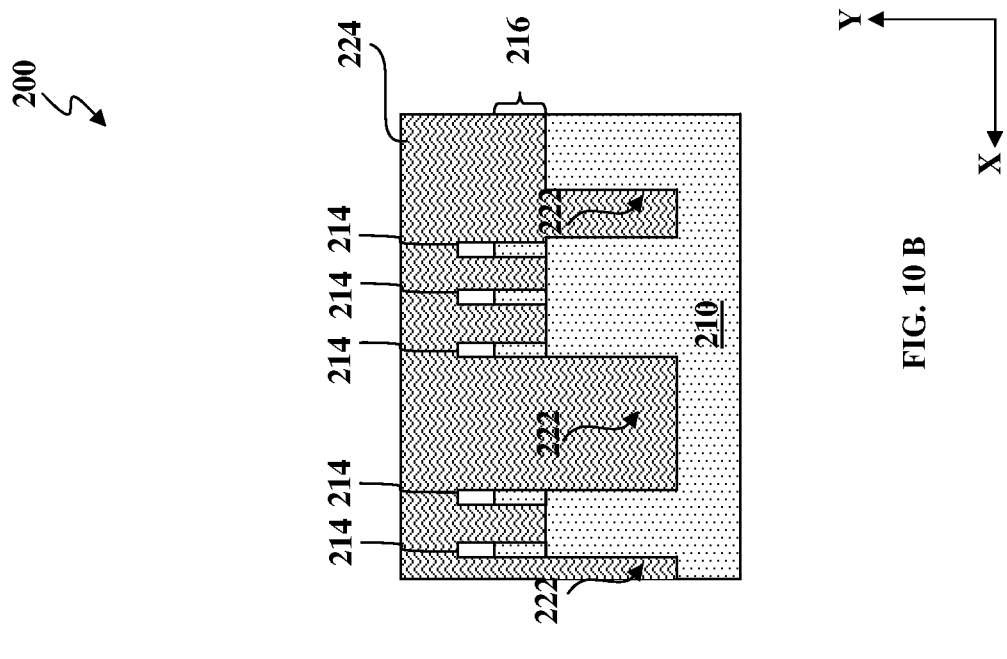
Figure 10:
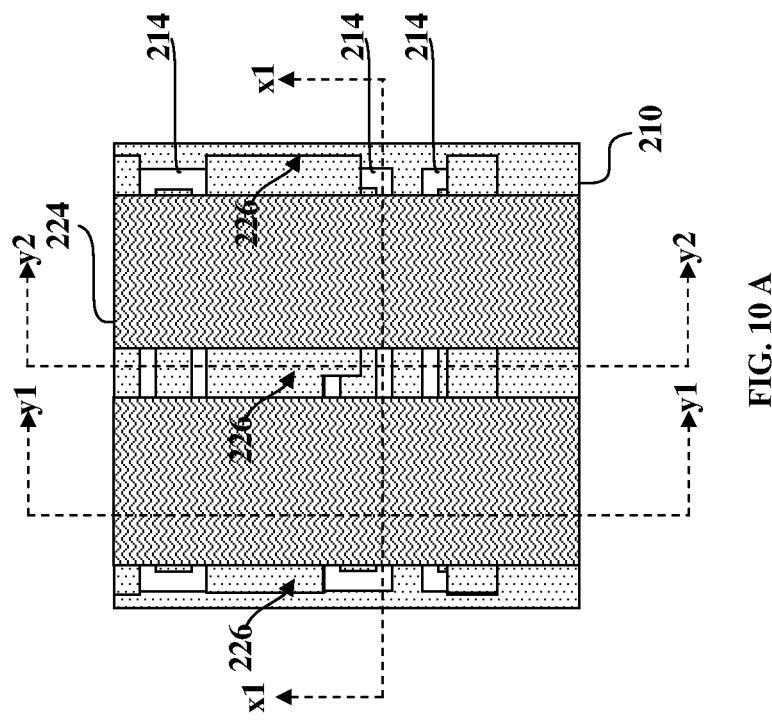
Figure 11:
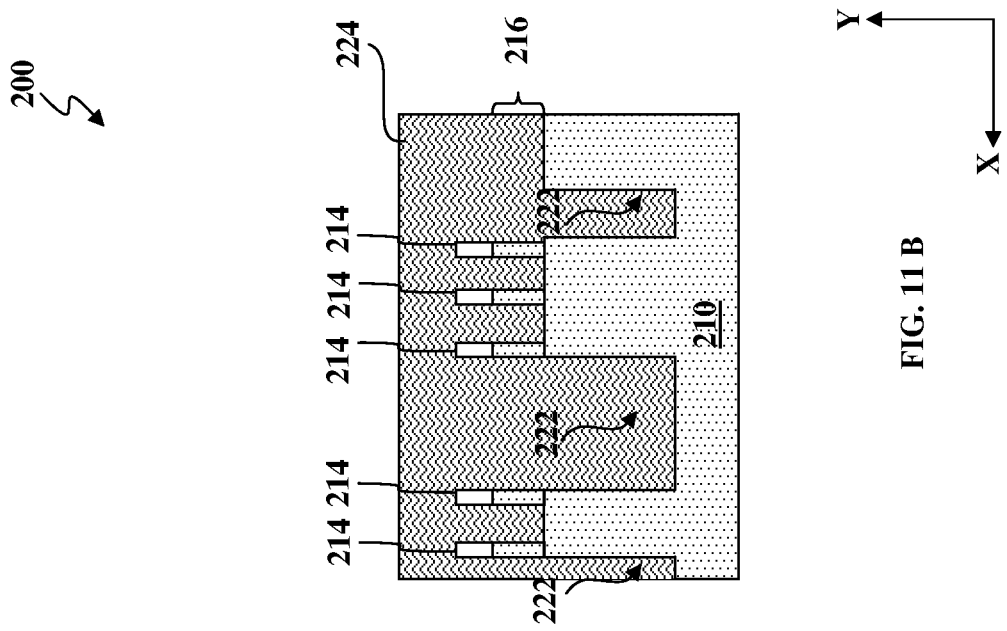
Figure 11:
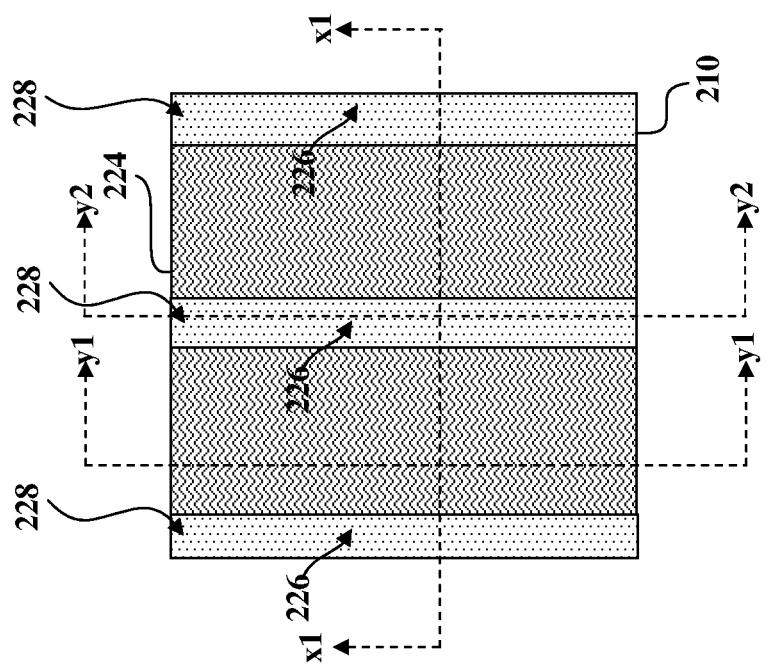
Figure 11:
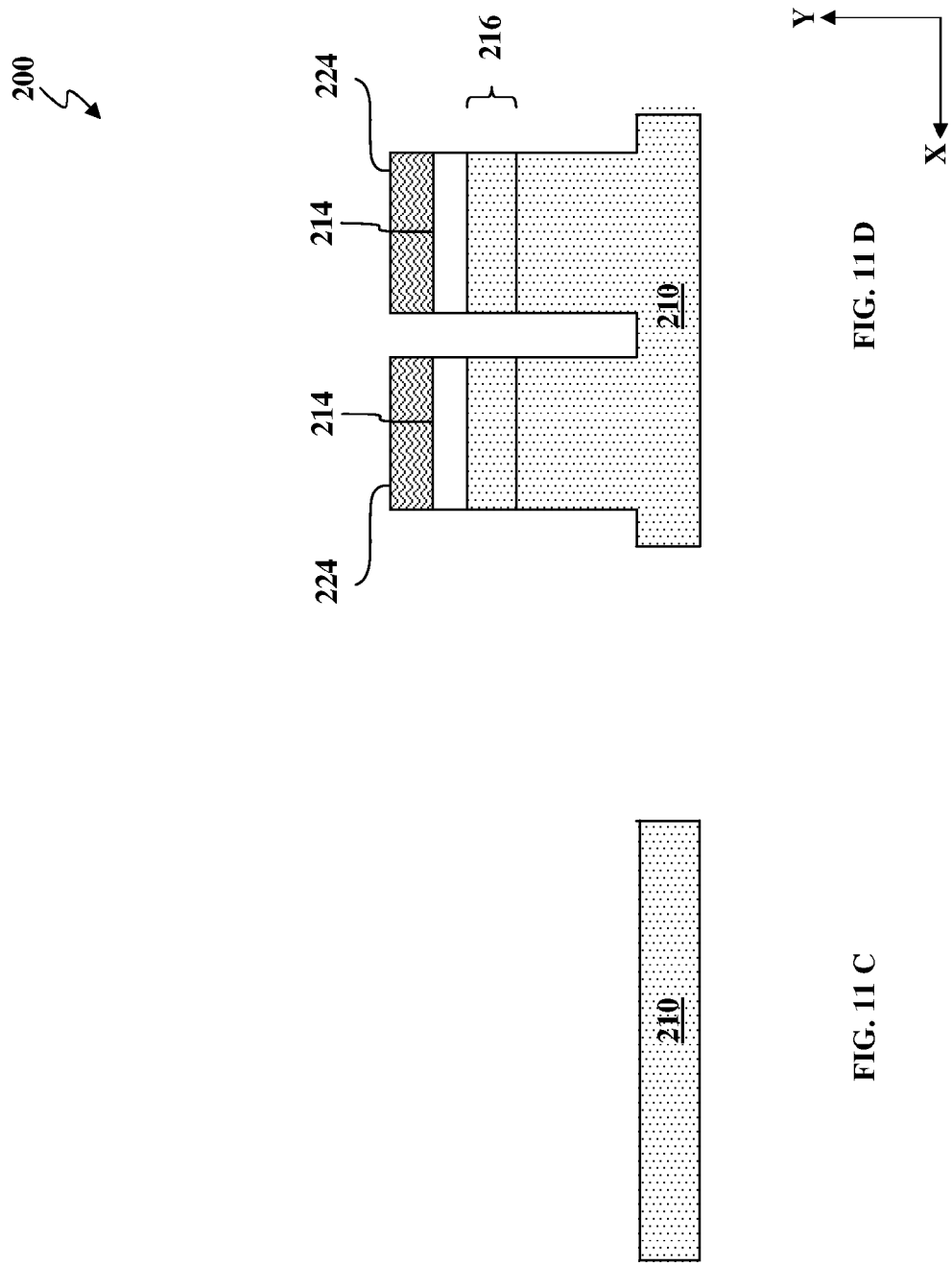
Figure 13:
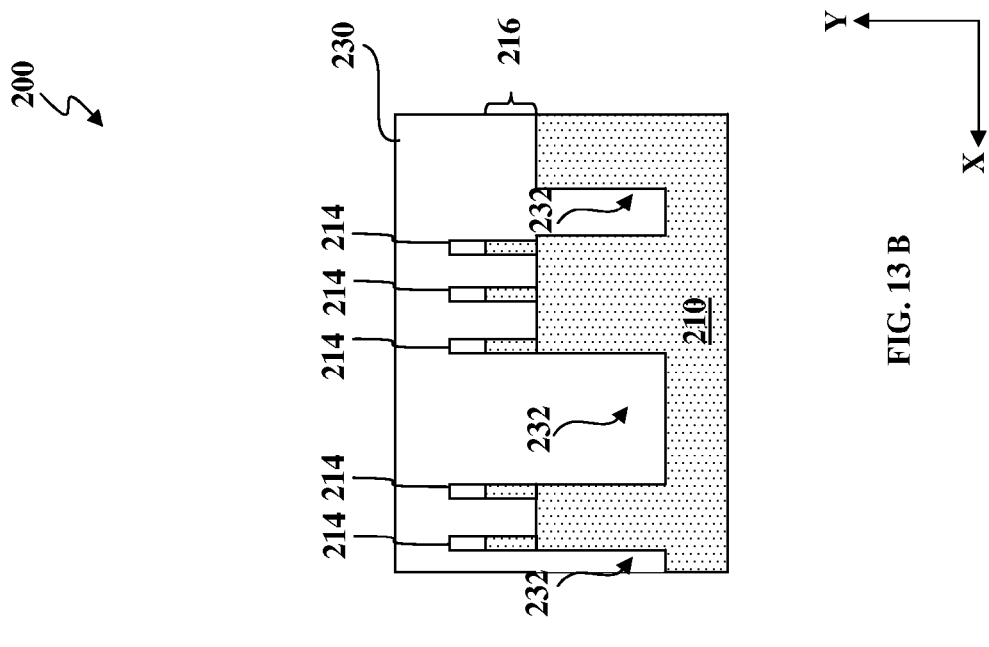
Figure 13:
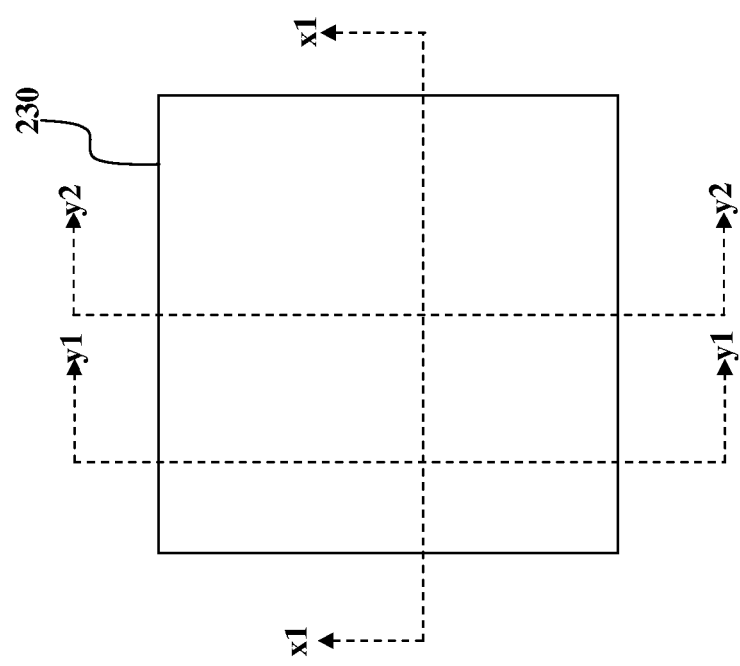

Referring to FIGS. 8A,B, after the first STI regions 222 have been formed in the substrate 210 in the horizontal direction, the first photoresist layer 218 is removed by any suitable process. For example, the first photoresist layer 218 may be removed by a liquid "resist stripper", which chemically alters the resist so that it no longer adheres to the underlying hard mask. Alternatively, the first photoresist layer 218 may be removed by a plasma containing oxygen, which oxidizes it.

Referring to FIGS. 9A-D, a second photoresist layer 224 is deposited over and substantially covers the FinFET device 200. Referring to FIGS. 10A-D, the second photoresist layer 224 is patterned by forming a second plurality of openings 226 in a second longitudinal direction. In the present embodiment, the second longitudinal direction is in the vertical (Y) direction. The first longitudinal direction and the second longitudinal direction are different and may be orthogonal, perpendicular, or have a different orientation. The second plurality of openings 226 define a second plurality of shallow trench isolation (STI) regions of the FinFET device 200. In the present embodiment, the second plurality of openings 226 are substantially linear and perpendicular to the first plurality of openings 220 (see FIGS. 6A,B-7A,B). Forming the second plurality of opening includes uncovering an end portion of at least one fin of the fin structure 216 that are overplayed by the spacers 214. Forming the second plurality of openings 226 includes exposing the first photoresist layer 218 to a pattern, performing a post-exposure bake process, and developing the photoresist layer to form a masking element. In some embodiments, the photoresist layer patterning may include processing steps of photoresist coating, soft baking, mask aligning, exposing pattern, post-exposure baking, developing photoresist, and hard baking. In some embodiments, the patterning can also be implemented or replaced by other proper methods, such as maskless photolithography, electron-beam writing, ion-beam writing, and molecular imprint.

Referring to FIGS. 11A-D, after the second photoresist layer 224 has been patterned, an etching process may be used to define the vertical boundaries of the active regions of the FinFET device 200 and to define second STI regions. The etching process first removes uncovered portions of the spacers 214, thereby uncovering a top surface of the fin structure 216 within the second plurality of openings 226. In one example, a hydrofluoric acid (HF) or buffered HF is used to remove the spacers 214. The second plurality of openings 226 of the second photoresist layer 224 are then used in an etching process to etch second STI regions 228 into the substrate 210. Notably, etching the second STI regions 228 include etching an end portion of at least one fin of the fin structure 216. The second STI regions 228 may have any height according to design requirements. In the present embodiment, for example, the second STI regions 228 have a height $H_{STI}$ (measured from the bottom surface of the substrate 210 to a top surface of the substrate 210) from about 0.1 micron to about 2 microns. In some embodiments, the etching process includes a wet etching process, a dry etching process, or a combination thereof. In another example, a dry etching process used to etch the substrate 210 includes a chemistry including fluorine-containing gas. In furtherance of the example, the chemistry of the dry etch includes CF4, SF6, or NF3.

Referring to FIGS. 12A-D, after the second STI regions 228 have been formed in the substrate 210, the second photoresist layer 224 is removed by any suitable process. For example, the second photoresist layer 224 may be removed by a liquid "resist stripper", which chemically alters the resist so that it no longer adheres to the underlying hard mask. Alternatively, the second photoresist layer 224 may be removed by a plasma containing oxygen, which oxidizes it.

Referring to FIGS. 13A-D, deposited over the substrate 210 is an insulation material 230. The insulation material 230 is deposited such that it substantially covers the substrate 210, thereby isolating each fin of the fin structure 216 and filling the STI regions 222, 228 to thereby form first and second STI features 232, 234. The insulation material 230 includes a material such as silicon oxide, silicon nitride, silicon oxynitride, low k materials, air gap, other suitable material, or any combinations thereof. In the present embodiment, the insulation material 230 includes silicon oxide. The silicon oxide can be deposited by a CVD process. In various examples, the silicon oxide can be formed by atomic layer deposition (ALD), high density plasma CVD (HDPCVD), other suitable methods, and/or combinations thereof. The silicon oxide may be alternatively formed by a high aspect ratio process (HARP). In various embodiments, an optional thermal oxide trench liner is grown to improve the trench interface. The CVD process, for example, can use chemicals including Hexachlorodisilane (HCD or Si2Cl6), Dichlorosilane (DCS or SiH2Cl2), Bis(TertiaryButylAmino)Silane (BTBAS or C8H22N2Si) and Disilane (DS or Si2H6). In some embodiments, the insulation material 230 can have a multi-layer structure, for example, a thermal oxide liner layer with silicon nitride formed over the liner.

Referring to FIGS. 14A-D, a planarizing process is performed on the FinFET device 200. In one embodiment, the planarizing process includes a chemical mechanical polishing (CMP) process applied to the FinFET device 200 to remove excessive portions of the insulation material 230. The planarizing process may be performed such that the spacers 214 are removed and a top portion of the fin structure 216 is uncovered. After the CMP process, an etching process is used to etch-back the insulation material 230 thereby uncovering sidewalls of each fin of the fin structure 216. The etching process that is used to etch-back insulation material 230 may include a wet etching, a dry etching process, or a combination thereof. The first and second STI features 232, 234 (which are formed in the first and second STI regions 222, 228) have a height ranging from about 0.5 microns to about 2.4 microns.

The FinFET device 200 may include additional features, which may be formed by subsequent processing. For example, subsequent processing may further form various contacts/vias/lines and multilayer interconnect features (e.g., metal layers and interlayer dielectrics) on the substrate, configured to connect the various features or structures of the FinFET device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structures. In another embodiment, tungsten is used to form tungsten plugs in the contact holes.

The disclosed semiconductor device 200 may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

The above method 100 significantly improves critical dimensions (CD) of the FinFET device 200 when compared to traditional FinFET devices and thereby improves device performance. For example, because the method 100 uses a two step (horizontal and a vertical) etching to define the active region boundary, the active regions of the FinFET device 200 experience fewer corner rounding concerns. Further, because the method 100 uses a two step STI etch, the process can sustain the two STI depths. Thus, the disclosed embodiments provide for an improved FinFET device that has improved/stable device performance, without adding significant cost to the manufacturing process and/or the device. It is understood that different embodiments may have different advantages, and that no particular advantage is necessarily required of any embodiment.

Thus, provided is a method. An exemplary method includes providing a substrate and forming a plurality of fins over the substrate. The method further includes forming a first opening in the substrate in a first longitudinal direction. The method further includes forming a second opening in the substrate in a second longitudinal direction. The first and second longitudinal directions are different. The method further includes depositing a filling material in the first and second openings.

In some embodiments, the method further includes performing a chemical mechanical polishing (CMP) process to remove excess filling material and uncover top portions of at least one fin of the plurality of fins of the fin structure; and etching back the filling material thereby uncovering sidewalls of at least one fin of the plurality of fins of the fin structure.

In some embodiments, forming a plurality of fins over the substrate includes: forming a patterned mask layer over the substrate; forming spacers on sidewalls of the patterned mask layer; selectively removing the mask layer; and using the spacers as a hard mask to etch the substrate and thereby form a fin structure over the substrate. In various embodiments, the patterned mask layer includes a first dielectric material, and the spacers include a second dielectric material different from the first dielectric material. In certain embodiments, the first dielectric material includes silicon nitride, the second dielectric material includes silicon oxide, and the filling material includes silicon oxide. In further embodiments, the first longitudinal direction is substantially perpendicular to the second longitudinal direction. In some embodiments, each fin of the plurality of fins of the fin structure includes a height less than about 400 nm.

Also provided is another method. The method includes forming a fin structure including one or more fins over a substrate. The method further includes etching the substrate in a first longitudinal direction thereby defining first isolation regions in the first longitudinal direction. The method further includes etching the substrate in a second longitudinal direction thereby defining second isolation regions in the second longitudinal direction, the first and second longitudinal directions being different. The method further includes depositing an insulation material over the substrate and within the first and second isolation regions. The method further includes performing a chemical mechanical polishing (CMP) process to remove excess insulation material. The method further includes etching back the insulation material to uncover sidewalls of each of the one or more fins of the fin structure.

In some embodiments, forming the fin structure including one or more fins over a substrate includes: forming a patterned mask layer over the substrate; forming spacers on sidewalls of the patterned mask layer; selectively removing the patterned mask layer; and etching the substrate using the spacers as a hard mask to form the fin structure including one or more fins. In various embodiments, etching the substrate in the first longitudinal direction includes: forming a first photoresist layer over the substrate; patterning the first photoresist layer; and using the patterned first photoresist layer to etch the substrate in the first longitudinal direction, wherein the patterned first photoresist layer includes a plurality of substantially parallel and linear openings in the first longitudinal direction. In certain embodiments, etching the substrate in the second longitudinal direction includes: forming a second photoresist layer over the substrate; patterning the second photoresist layer; and using the patterned second photoresist layer to etch the substrate in the second longitudinal direction, wherein the patterned second photoresist layer includes a plurality of substantially parallel and linear openings in the second longitudinal direction. In some embodiments, the patterned mask layer includes a first dielectric material, and the spacers include a second dielectric material different from the first dielectric material. In various embodiments, the first dielectric material includes silicon nitride, the second dielectric material includes silicon oxide, and the insulation material includes silicon oxide. In certain embodiments, the first longitudinal direction is substantially perpendicular to the second longitudinal direction. In further embodiments, etching the substrate in the second longitudinal direction includes etching an end portion of at least one fin of the fin structure.

Also provided is a method of forming a FinFET device. The method includes forming a fin structure including one or more fins over a substrate. The method further includes forming a first patterned photoresist layer over the substrate, the first patterned photoresist layer including a plurality of substantially linear openings having a first longitudinal direction. The method further includes etching the substrate using the first patterned photoresist layer thereby defining first shallow trench isolation (STI) regions in the first longitudinal direction, the first STI regions defining a first boundary of an active region including at least one fin of the fin structure. The method further includes forming a second patterned photoresist layer over the substrate, the second patterned photoresist layer including a plurality of substantially linear openings having a second longitudinal direction different from the first longitudinal direction. The method further includes etching the substrate using the second patterned photoresist layer thereby defining second STI regions in the second longitudinal direction, the second STI regions defining a second boundary of the active region including at least one fin of the fin structure. The method further includes depositing an insulation material substantially filling the STI regions and covering the substrate.

In some embodiments, the method further includes performing a chemical mechanical polishing (CMP) process to remove excess insulation material and the spacers thereby uncovering a top surface of at least one fin of the fin structure; and etching back the insulation material to uncover sidewalls of each of the one or more fins of the fin structure.

In some embodiments, the patterned mask layer includes a first dielectric material, and the spacers include a second dielectric material different from the first dielectric material. In various embodiments, the first longitudinal direction is substantially perpendicular to the second longitudinal direction. In certain embodiments, etching the substrate in the second longitudinal direction includes etching an end portion of at least one fin of the fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a substrate;
forming a fin structure including a plurality of fins over the substrate;
after forming the fin structure, etching the substrate in a first longitudinal direction thereby forming a first opening in the first longitudinal direction, wherein etching the substrate in the first longitudinal direction includes removing at least a part of a first fin of the plurality of fins;
after forming the fin structure, forming a second opening in the substrate in a second longitudinal direction, wherein the first and second longitudinal directions are different; and
depositing a filling material in the first and second openings performing a chemical mechanical polishing (CMP) process to remove excess filling material and uncover top portions of at least one fin of the plurality of fins of the fin structure and etching back the filling material thereby uncovering sidewalls of at least one fin of the plurality of fins of the fin structure.

2. The method of claim 1 wherein forming the plurality of fins over the substrate includes:
forming a patterned mask layer over the substrate;
forming spacers on sidewalls of the patterned mask layer;
selectively removing the patterned mask layer; and
using the spacers as a hard mask to etch the substrate and thereby form the fin structure over the substrate.

3. The method of claim 2 wherein the patterned mask layer includes a first dielectric material, and
wherein the spacers include a second dielectric material different from the first dielectric material.

4. The method of claim 3 wherein the first dielectric material includes silicon nitride,
wherein the second dielectric material includes silicon oxide, and
wherein the filling material includes silicon oxide.

5. The method of claim 1 wherein the first longitudinal direction is substantially perpendicular to the second longitudinal direction.

6. The method of claim 1 wherein each fin of the plurality of fins of the fin structure includes a height less than about 400 nm.

7. The method of claim 1 wherein
wherein forming the second opening in the substrate in the second longitudinal direction includes removing part of a second fin of the plurality of fins.

8. A method, comprising:
forming a fin structure including first and second fins over a substrate, wherein forming the fin structure includes:
forming a patterned mask layer over the substrate;
forming spacers on sidewalls of the patterned mask layer;
selectively removing the patterned mask layer; and
etching the substrate using the spacers as a hard mask to form the fin structure including first and second fins;
after forming the fin structure, etching the substrate including the fin structure in a first longitudinal direction thereby defining first isolation regions in the first longitudinal direction, wherein etching the substrate in the first longitudinal direction includes removing at least a part of the first fin of the fin structure;
after defining first isolation regions, etching the substrate including the fin structure in a second longitudinal direction thereby defining second isolation regions in the second longitudinal direction, the first and second longitudinal directions being different, wherein etching the substrate in the second longitudinal direction includes removing at least a part of the second fin of the fin structure;
depositing an insulation material over the substrate and within the first and second isolation regions;
performing a chemical mechanical polishing (CMP) process to remove excess insulation material; and
etching back the insulation material to uncover sidewalls of the first and second fins of the fin structure.

9. The method of claim 8 wherein etching the substrate including the fin structure in the first longitudinal direction includes:
forming a first photoresist layer over the substrate;
patterning the first photoresist layer; and
using the patterned first photoresist layer to etch the substrate in the first longitudinal direction,
wherein the patterned first photoresist layer includes a plurality of substantially parallel and linear openings in the first longitudinal direction.

10. The method of claim 9 wherein etching the substrate in the second longitudinal direction includes:
forming a second photoresist layer over the substrate;
patterning the second photoresist layer; and
using the patterned second photoresist layer to etch the substrate in the second longitudinal direction,
wherein the patterned second photoresist layer includes a plurality of substantially parallel and linear openings in the second longitudinal direction.

11. The method of claim 8 wherein the patterned mask layer includes a first dielectric material, and
wherein the spacers include a second dielectric material different from the first dielectric material.

12. The method of claim 11 wherein the first dielectric material includes silicon nitride,
wherein the second dielectric material includes silicon oxide, and
wherein the insulation material includes silicon oxide.

13. The method of claim 8 wherein the first longitudinal direction is substantially perpendicular to the second longitudinal direction.

14. The method of claim 8 wherein etching the substrate in the second longitudinal direction includes etching an end portion of at least one fin of the fin structure.

15. A method of forming a FinFET device, comprising:
etching a fin structure into a substrate;
forming a first patterned photoresist layer over the etched fin structure and the substrate, the first patterned photoresist layer including a plurality of substantially linear openings having a first longitudinal direction, wherein a first opening of the plurality of substantially linear openings of the first patterned photoresist layer exposes a top surface of a first fin of the fin structure;

etching the substrate using the first patterned photoresist layer thereby defining first shallow trench isolation (STI) regions in the first longitudinal direction, the first STI regions defining a first boundary of an active region including at least one fin of the fin structure;

forming a second patterned photoresist layer over the etched fin structure and the substrate, the second patterned photoresist layer including a plurality of substantially linear openings having a second longitudinal direction different from the first longitudinal direction, wherein a second opening of the plurality of substantially linear openings of the second patterned photoresist layer exposes a top surface of the first fin of the fin structure;

etching the substrate using the second patterned photoresist layer thereby defining second STI regions in the second longitudinal direction, the second STI regions defining a second boundary of the active region including at least one fin of the fin structure; and depositing an insulation material substantially filling the first and second STI regions and covering the substrate.

16. The method of claim 15 further comprising:

performing a chemical mechanical polishing (CMP) process to remove excess insulation material and the spacers thereby uncovering a top surface of at least one fin of the fin structure; and etching back the insulation material to uncover sidewalls of the first fin of the fin structure.

17. The method of claim 15 wherein forming the fin structure over the substrate includes:

forming a patterned mask layer over the substrate;
forming spacers on sidewalls of the patterned mask layer;
selectively removing the patterned mask layer; and
using the spacers as a hard mask to etch the substrate and thereby form the fin structure over the substrate,
wherein the patterned mask layer includes a first dielectric material, and
wherein the spacers include a second dielectric material different from the first dielectric material.

18. The method of claim 15 wherein the first longitudinal direction is substantially perpendicular to the second longitudinal direction.

19. The method of claim 15 wherein etching the substrate in the second longitudinal direction includes etching an end portion of the exposed first fin of the fin structure.

* * * * *